United States Patent
Chinthakindi et al.

(10) Patent No.: US 8,119,491 B2
(45) Date of Patent: *Feb. 21, 2012

(54) METHODS OF FABRICATING PASSIVE ELEMENT WITHOUT PLANARIZING AND RELATED SEMICONDUCTOR DEVICE

(75) Inventors: Anil K. Chinthakindi, Wappingers Falls, NY (US); Timothy J. Dalton, Ridgefield, CT (US); Ebenezer E. Eshun, Newburgh, NY (US); Jeffrey P. Gambino, Westford, VT (US); Anthony K. Stamper, Williston, VT (US); Kunal Vaed, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 498 days.

This patent is subject to a terminal disclaimer.

(21) Appl. No.: 12/106,374

(22) Filed: Apr. 21, 2008

(65) Prior Publication Data

US 2008/0224259 A1    Sep. 18, 2008

Related U.S. Application Data

(63) Continuation of application No. 11/427,457, filed on Jun. 29, 2006, now Pat. No. 7,427,550.

(51) Int. Cl.
H01L 21/20 (2006.01)
(52) U.S. Cl. ........ 438/381; 438/384; 438/393; 438/622; 257/E21.004; 257/E21.008
(58) Field of Classification Search .................. 438/239, 438/250, 381, 382, 384, 393, 622; 257/E21.004, 257/E21.008
See application file for complete search history.

(56) References Cited

U.S. PATENT DOCUMENTS

| 5,361,234 A | 11/1994 | Iwasa |
| 5,530,418 A | 6/1996 | Hsu et al. |
| 6,271,574 B1 | 8/2001 | Delpech et al. |

(Continued)

FOREIGN PATENT DOCUMENTS

JP    2004247520 A2    9/2004

(Continued)

OTHER PUBLICATIONS

Chinthakindi et al., U.S. Appl. No. 11/427,457, Office Action Communication, Jun. 28, 2007, 8 pages.

(Continued)

*Primary Examiner* — Mary Wilczewski
*Assistant Examiner* — Toniae Thomas
(74) *Attorney, Agent, or Firm* — Katherine S. Brown; Hoffman Warnick LLC

(57) ABSTRACT

Methods of fabricating a passive element and a semiconductor device including the passive element are disclosed including the use of a dummy passive element. A dummy passive element is a passive element or wire which is added to the chip layout to aid in planarization but is not used in the active circuit. One embodiment of the method includes forming the passive element and a dummy passive element adjacent to the passive element; forming a dielectric layer over the passive element and the dummy passive element, wherein the dielectric layer is substantially planar between the passive element and the dummy passive element; and forming in the dielectric layer an interconnect to the passive element through the dielectric layer and a dummy interconnect portion overlapping at least a portion of the dummy passive element. The methods eliminate the need for planarizing.

10 Claims, 6 Drawing Sheets

U.S. PATENT DOCUMENTS

| | | | |
|---|---|---|---|
| 6,295,721 | B1 | 10/2001 | Tsai |
| 6,468,894 | B1 | 10/2002 | Yang et al. |
| 6,611,015 | B2 * | 8/2003 | Ozaki et al. .................... 257/296 |
| 6,657,247 | B2 | 12/2003 | Yoshiyama et al. |
| 6,732,422 | B1 | 5/2004 | Thei et al. |
| 6,914,840 | B2 | 7/2005 | Agata |
| 7,394,145 | B2 * | 7/2008 | Chinthakindi et al. ....... 257/528 |
| 7,427,550 | B2 * | 9/2008 | Chinthakindi et al. ....... 438/381 |
| 2002/0173111 | A1 | 11/2002 | Kasai |
| 2003/0094634 | A1 * | 5/2003 | Cho et al. ...................... 257/212 |
| 2005/0026341 | A1 | 2/2005 | Nuetzel |
| 2005/0118795 | A1 * | 6/2005 | Hidaka et al. ................. 438/593 |
| 2005/0145987 | A1 | 7/2005 | Okuda et al. |
| 2005/0205965 | A1 | 9/2005 | Yang |
| 2006/0145347 | A1 * | 7/2006 | Aida .............................. 257/758 |
| 2006/0237819 | A1 | 10/2006 | Kikuta et al. |

FOREIGN PATENT DOCUMENTS

| | | |
|---|---|---|
| JP | 2004253481 A | 9/2004 |
| KR | 2004037842 A * | 5/2004 |

OTHER PUBLICATIONS

Chinthakindi et al., U.S. Appl. No. 11/427,457, Office Action Communication, Nov. 16, 2007, 7 pages.

Chinthakindi et al., U.S. Appl. No. 11/427,457, Notice of Allowance and Fees Due, Mar. 25, 2008, 11 pages.

Chinthakindi et al., U.S. Appl. No. 11/928,798, Notice of Allowance and Fees Due, May 19, 2008, 18 pages.

* cited by examiner

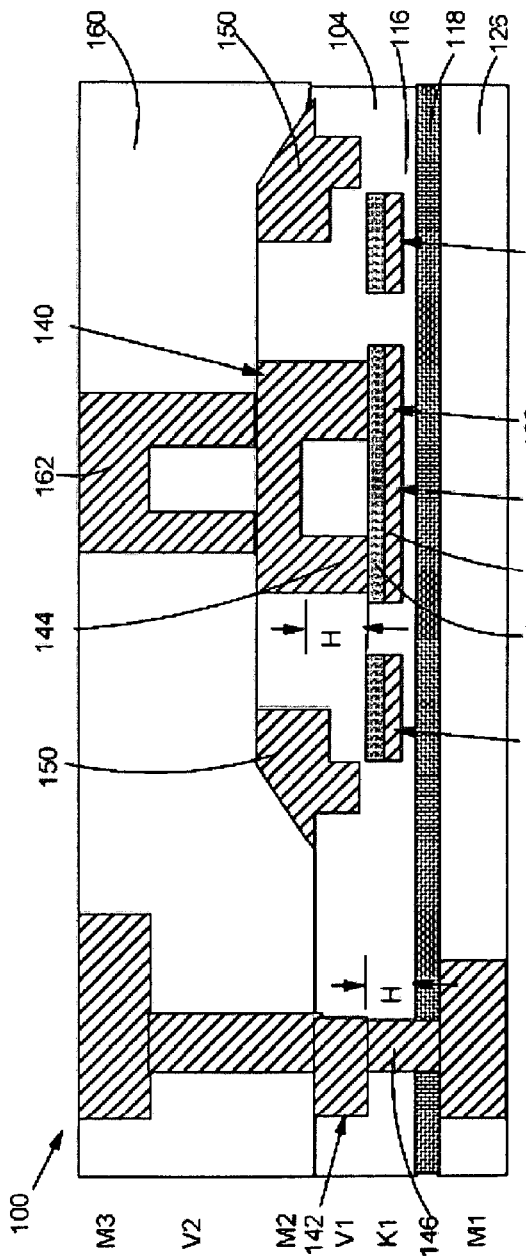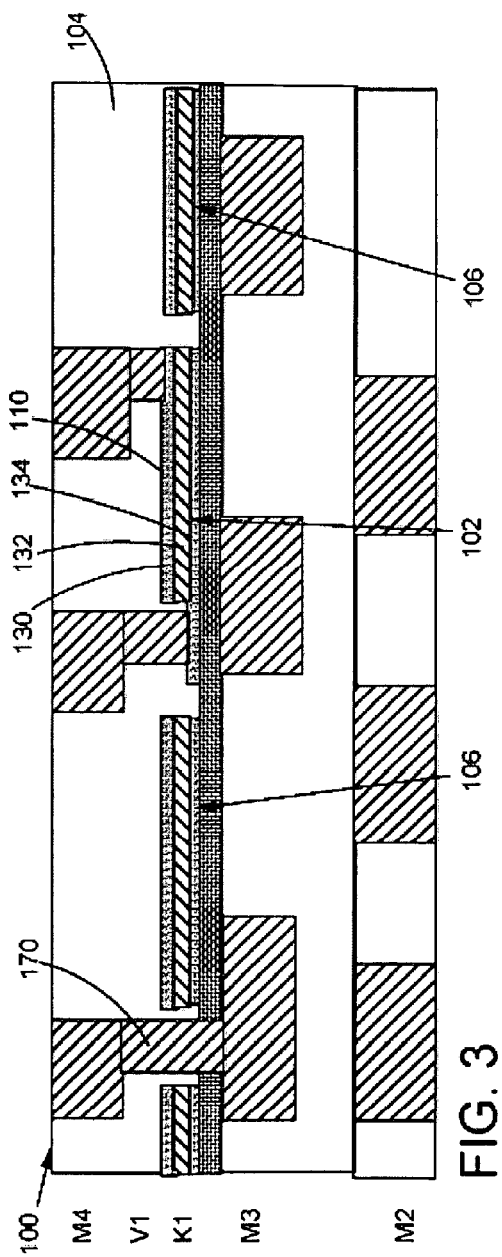

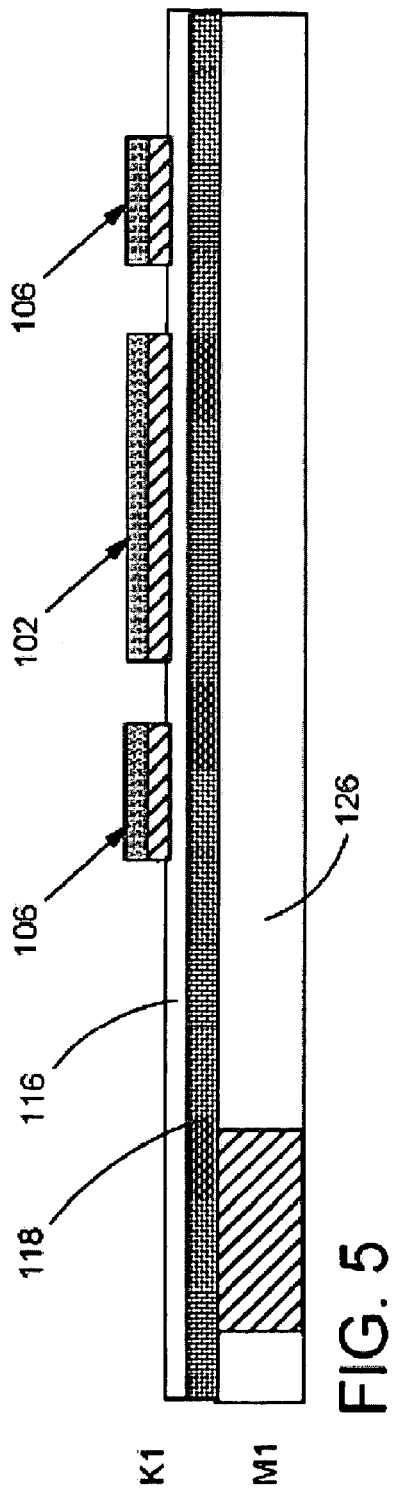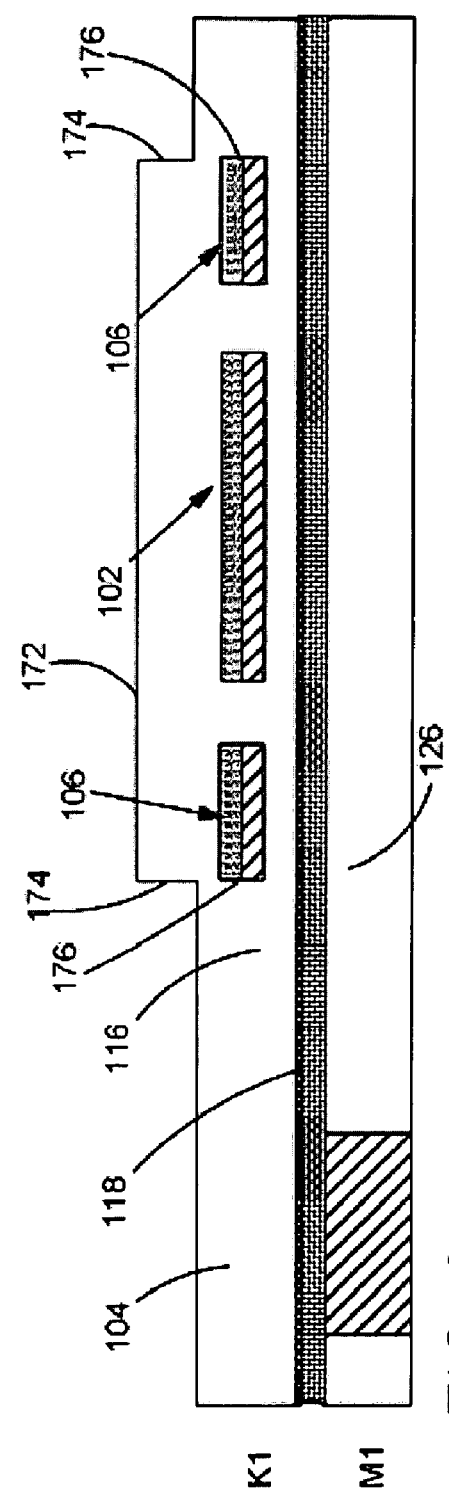

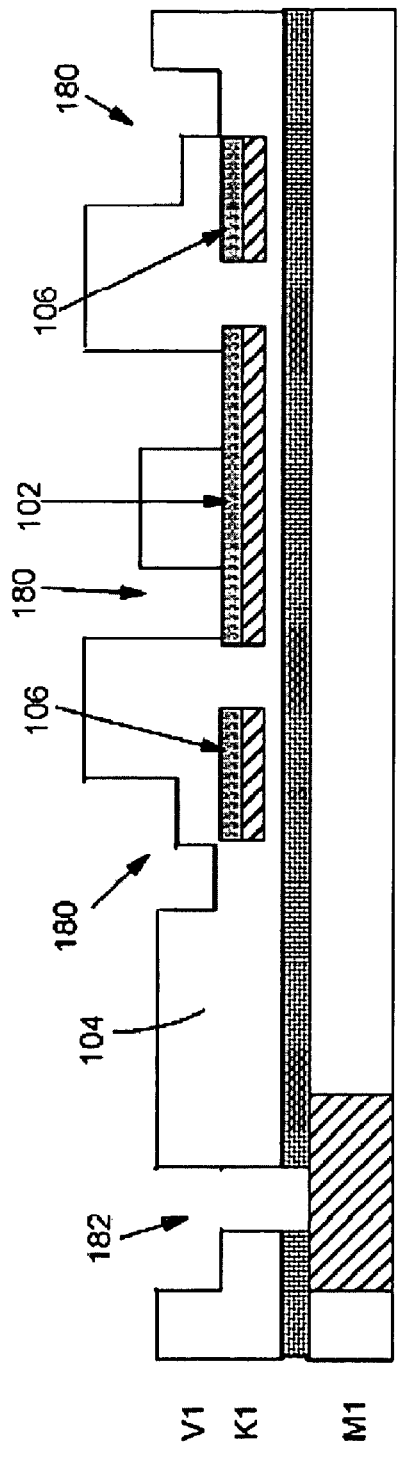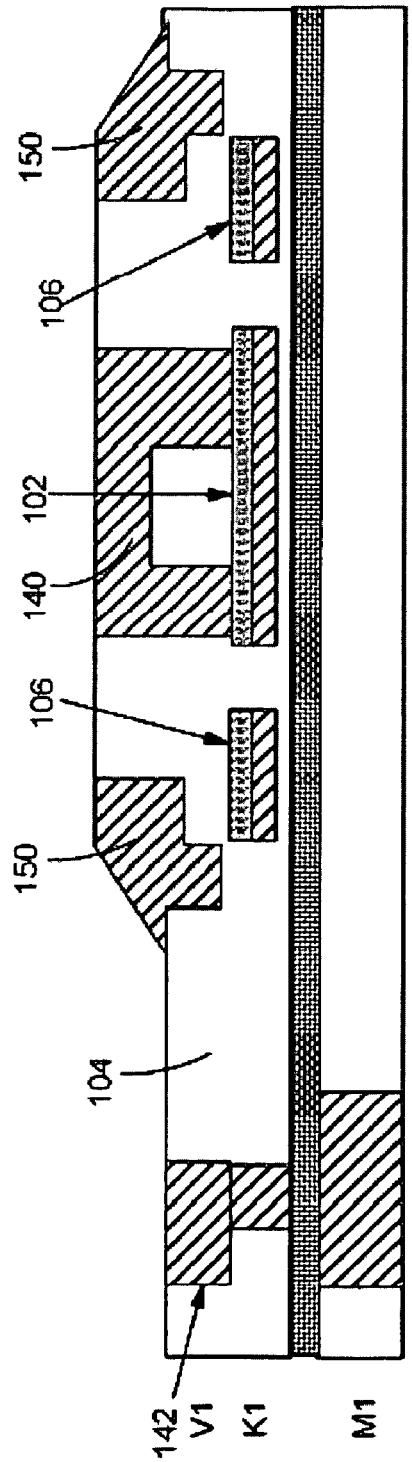

METHODS OF FABRICATING PASSIVE ELEMENT WITHOUT PLANARIZING AND RELATED SEMICONDUCTOR DEVICE

The current application is a continuation application of co-pending U.S. patent application Ser. No. 11/427,457, filed on Jun. 29, 2006 now U.S. Pat. 7,427,550, which is hereby incorporated by reference.

BACKGROUND OF THE INVENTION

1. Technical Field

The invention relates generally to semiconductor device fabrication, and more particularly, to methods of fabricating a passive element while eliminating interlevel chemical mechanical polishing (CMP) in back-end-of-line (BEOL) processes.

2. Background Art

In the semiconductor fabrication industry, passive elements such as thin film resistors or metal-insulator-metal (MIM) capacitors are typically formed in dielectrics in back-end-of-line (BEOL) layers. BEOL refers to the portion of the integrated circuit fabrication where the active components (transistors, resistors, etc.) are interconnected with wiring on the wafer. BEOL processes typically employ a "damascene process" in which an interconnect pattern is first lithographically defined in a layer of interlevel dielectric, then metal is deposited to fill the resulting trenches, and then excess metal is removed by chemical-mechanical-polishing (CMP) (planarization). Planarization of the interlevel dielectrics in the BEOL layers is required for formation of passive elements.

This situation presents a number of challenges. First, known CMP processes do not allow for dielectric interlevel planarization of BEOL layers for current technologies, e.g., 65 nm. For example, FIG. 1 shows a semiconductor device including a thin film resistor 10 including a first silicon carbon nitride (SiCN) layer 12 of thickness T and a tantalum nitride (TaN) layer 14 having a thickness T. A silicon oxide ($SiO_2$) layer 16 of thickness T and a second SiCN layer 18 of thickness T/2 are under resistor 10. Together, resistor 10 and underlying layers 16 and 18 may have a total thickness of 3.5 T. Resistor 10 is positioned within a dielectric layer 20, e.g., of silicon oxide ($SiO_2$). A metal wire 22 and contact via 24 extend through dielectric layer 20 to an underlying layer 26, e.g., a first metal layer, and each have a thickness 3 T (not shown for clarity). CMP of interlevel dielectric layer 20 typically requires 2.5 T height removal to fully planarize the layer. Hence, this height removal requirement prevents usage of passive elements at early BEOL layers for current technologies because CMP would destroy resistor 10. In addition, CMP would induce scratches, defects, and height variability for contact via(s) 24, and is incompatible with many dielectrics for current technologies. One approach to this problem is to position resistor 10 in later BEOL layers away from first metal layer, e.g., layer 26, with thicker wires, but this technique is undesirable due to thermal issues, i.e., the need to place the resistor close to the silicon substrate to increase heat dissipation, wiring layout, or other reasons. In another approach, resistor 10 is positioned within a silicon layer or a first metallization layer. However, this is disadvantageous because thermal and other issues, such as cross-talk, typically prevent use of the silicon layer, and use of the first metallization layer creates physical interference issues for interconnects.

A second challenge to formation of passive elements in BEOL layers is presented by the fact that equipment for BEOL equipment, which typically does not include CMP tools for interlevel dielectrics, is typically isolated from front-end-of-line (FEOL) equipment that includes CMP tools for dielectrics. BEOL processing typically requires tools for planarization of metals, not dielectrics. As a result, fabrication of passive elements in the BEOL layers requires providing potentially duplicate tools for the BEOL process and the FEOL process, due to concerns about metallic or mobile ion contamination of FEOL processes and tools. The expense of this requirement is prohibitive.

SUMMARY OF THE INVENTION

Methods of fabricating a passive element and a semiconductor device including the passive element are disclosed including the use of a dummy passive element. A dummy passive element is a passive element or wire which is added to the chip layout to aid in planarization but is not used in the active circuit. One embodiment of the method includes forming the passive element and a dummy passive element adjacent to the passive element; forming a dielectric layer over the passive element and the dummy passive element, wherein the dielectric layer is substantially planar between the passive element and the dummy passive element; and forming in the dielectric layer an interconnect to the passive element through the dielectric layer and a dummy interconnect portion overlapping at least a portion of the dummy passive element. The methods eliminate the need for planarizing.

A first aspect of the invention provides a method of fabricating a passive element, the method comprising: forming the passive element and a dummy passive element adjacent to the passive element; forming a first dielectric layer over the passive element and the dummy passive element, wherein the first dielectric layer is substantially planar over an area between the passive element and the dummy passive element; and forming a first interconnect to the passive element through the first dielectric layer and a dummy interconnect portion overlapping at least a portion of the dummy passive element.

A second aspect of the invention provides a semiconductor device comprising: a passive element in a first dielectric layer; a dummy passive element in the first dielectric layer adjacent to the passive element; a first interconnect to the passive element in the first dielectric layer; and a second interconnect to structure other than the passive element in the first dielectric layer, wherein a via of the first interconnect and a via of the second interconnect have substantially the same height.

A third aspect of the invention provides a method of fabricating a passive element, the method comprising: forming the passive element and a dummy passive element adjacent to the passive element; forming a dielectric layer over the passive element and the dummy passive element; forming in the dielectric layer an interconnect to the passive element through the dielectric layer and a dummy interconnect portion overlapping at least a portion of the dummy passive element; and forming another dielectric layer including another dummy passive element and another dummy interconnect portion overlapping at least a portion of the dummy interconnect portion.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which:

FIG. 2 shows a cross-sectional view of a semiconductor device including a passive element according to one embodiment of the invention.

FIG. 3 shows a cross-sectional view of a semiconductor device including a passive element according to another embodiment of the invention.

FIGS. 5-8 show one embodiment of a method of fabricating a passive element according to the invention.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1:
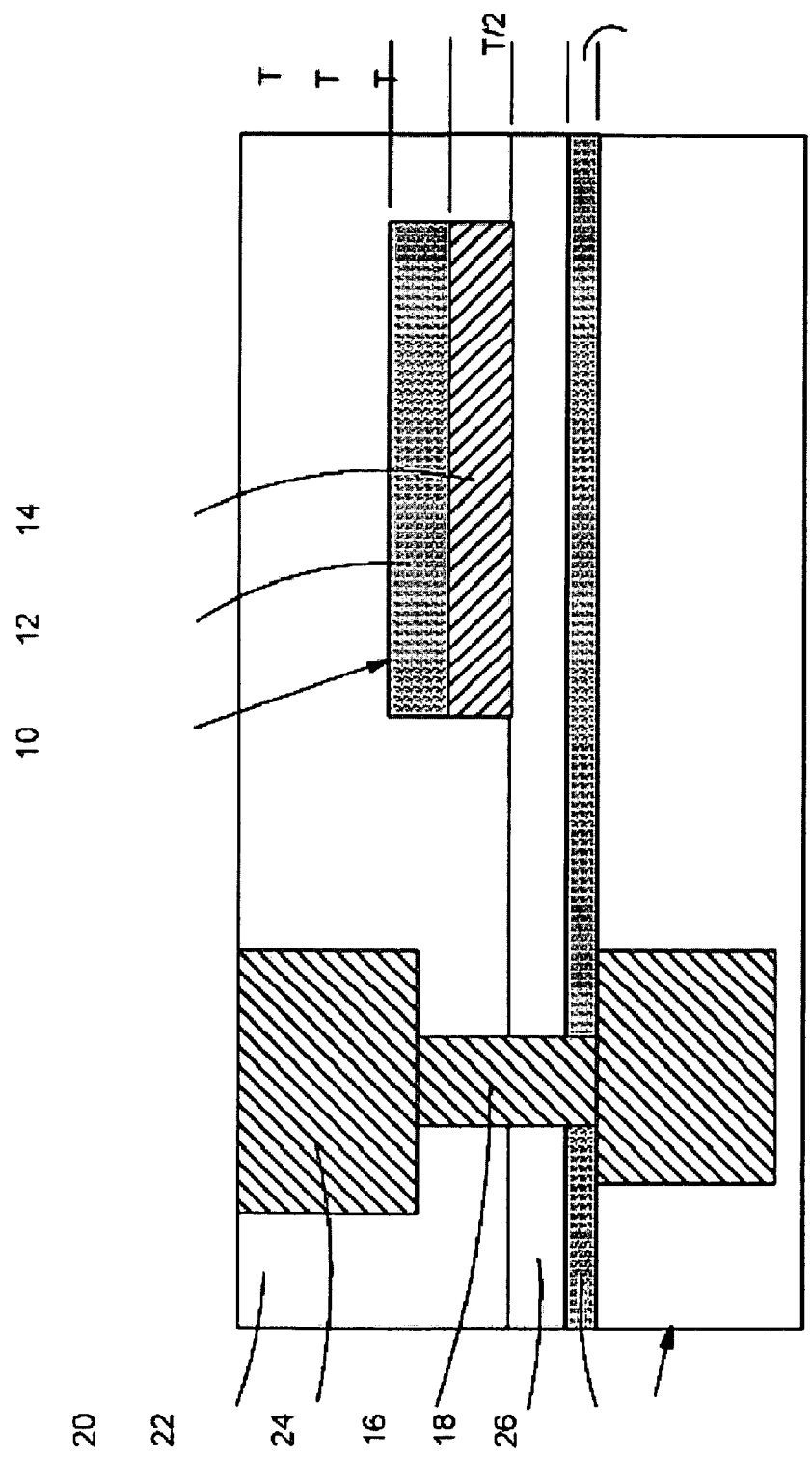
FIG. 1 shows a cross-sectional view of a conventional semiconductor device including a planar passive element.

FIGS. 2-3 show a cross-sectional view of a semiconductor device 100 according to embodiments of the invention. In either figure, semiconductor device 100 includes a (planar) passive element 102 in a dielectric layer 104, and a dummy passive element 106 in dielectric layer 104 adjacent to passive element 102. A "dummy passive element" is a passive element or wire which is added to the chip layout to aid in planarization but is not used in the active circuit. Passive element 102 may take the form of any now known or later developed planar passive element such as a thin-film resistor 108 (FIG. 2), a metal-insulator-metal (MIM) capacitor 110 (FIG. 3), a micromechanical (MEM) device, etc. Passive element 102 and dummy passive element 106 each may have substantially the same structure. For example, if passive element 102 includes thin film resistor 108 (FIG. 2), passive element may include a silicon carbon nitride (SiCN) layer 112 and a tantalum nitride (TaN) layer 114 with a silicon oxide ($SiO_2$) layer 116 and a second SiCN layer 118 underneath layers 112 and 116. In contrast, if passive element 102 includes MIM capacitor 110 (FIG. 3), it may include a metal layer 130, an insulator layer 132 and a second metal layer 134. Metal layers 130, 134 and insulator layer 132 may include any now known or later developed materials used for MIM capacitors such as titanium nitride/aluminum copper/titanium nitride (TiN/AlCu/TiN), titanium nitride/tungsten/titanium nitride (TiN/W/TiN), titanium nitride/tantalum/titanium nitride (TiN/Ta/TiN), tungsten (W), tantalum (Ta), and the like. FIG. 2 shows passive element 102 formed over a first metal layer 126. It should be recognized, however, as shown in FIG. 3, that passive element 102 and dummy passive element 106 may be positioned in any BEOL layer.

Referring to FIG. 2, in one embodiment, semiconductor device 100 may further include a first interconnect 140 to passive element 102 in dielectric layer 104, and a second interconnect 142 to structure other than passive element 102 in dielectric layer 104. In this case, a via 144 of first interconnect 140 and a via 146 of second interconnect 142 have substantially the same height H. As also illustrated in FIG. 2, a dummy interconnect portion 150 may overlap at least a portion of dummy passive element 106. In addition, as shown in FIG. 2, one or more other dielectric layers 160 (only one shown for clarity) may be provided over dielectric layer 104 and each layer 160 may include a third interconnect 162 to first interconnect 140. Each dielectric layer 160 may include another dummy passive element similar to layer 106, adjacent to layer 106, with another dummy interconnect portion (not shown).

Figure 4:
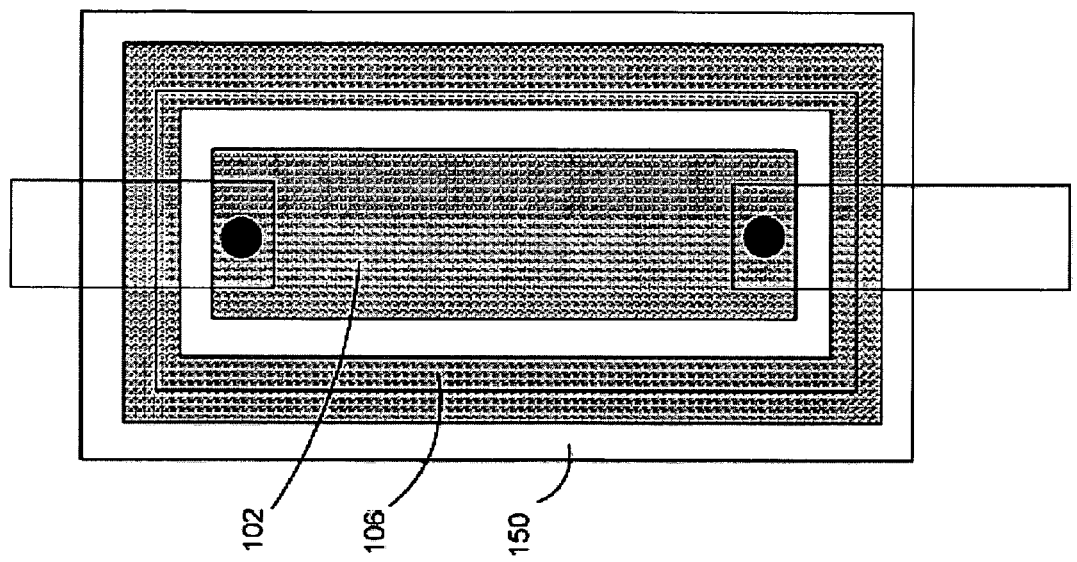
FIG. 4 shows a top view of the semiconductor device of FIG. 2.

Referring to the top view of FIG. 4, in one embodiment, dummy passive element 106 substantially surrounds passive element 102. In other embodiments, dummy passive element 106 may be discontinuous. Similarly, dummy interconnect portion 150 may substantially surround passive element 102. In other embodiments, dummy interconnect portion 150 may be discontinuous. As illustrated in FIG. 4, in one embodiment, dummy interconnect portion 150 overlaps dummy passive element 106 along substantially all of dummy passive element 106.

In one embodiment, shown in FIG. 2, dummy passive element 106 may be positioned adjacent to passive element 102, and may not extend for any substantial distance from passive element 102. In contrast, in other embodiments, as shown in FIG. 3, dummy passive element 106 may be present in substantially all of dielectric layer 104 except where a via 170 or passive element 102 exists.

Turning to FIGS. 5-8, one embodiment of a method of fabricating passive element 102 as shown in FIG. 2 will now be described. Similar embodiments may be employed to generate passive element 102 as shown in FIG. 3. In a first step, shown in FIG. 5, passive element 102 is formed and dummy passive element 106 is formed adjacent to passive element 102. Passive element 102 and dummy passive element 106 may be formed in any now known or later developed fashion, e.g., such as chemical vapor deposition (CVD), low-pressure CVD (LPCVD), plasma-enhanced CVD (PECVD), semi-atmosphere CVD (SACVD), high density plasma CVD (HD-PCVD), spin-on methods, physical vapor deposition (PVD), atomic layer deposition (ALD), etc., of SiCN layer 112 and TaN layer 114 over $SiO_2$ layer 116 and SiCN layer 118, and patterning of SiCN layer 112 and TaN layer 114. As illustrated, passive element 102 and dummy passive element 106 are generated over $SiO_2$ layer 116 over SiCN layer 118 over first metal layer 126. However, as stated above, it should be recognized that passive element 102 and dummy passive element 106 may be generated in practically any BEOL layer, e.g., as shown in FIG. 3. Furthermore, dummy passive element 102, as shown in FIG. 3, may be formed such that it is present in substantially all of dielectric layer 104 except where via 170 or passive element 102 exists. As mentioned above and as shown in FIG. 4, dummy passive element 106 may be formed such that it substantially surrounds passive element 102.

In FIG. 6, dielectric layer 104 is formed over passive element 102 and dummy passive element 106. Dielectric layer 104 may include any now known or later developed dielectric materials such as $SiO_2$, fluorinated $SiO_2$ (FSG), hydrogenated silicon oxycarbide (SiCOH), porous SiCOH, etc. Passive element 102 and dummy passive element 106 are sufficiently close together so as to 'pinch off' dielectric layer 104. That is, dielectric layer 104 does not form between passive element 102 and dummy passive element 106 in such a way to become non-planar on a surface 172 thereof. Rather, dielectric layer 104 is substantially planar over an area between passive element 102 and dummy passive element 106. However, the combination of passive element 102 and dummy passive element 106 forms a step 174 in dielectric layer 104 above an outer edge 176 of dummy passive element 106, the significance of which will become apparent herein.

Next, as shown in FIGS. 7-8, interconnect 140 (FIG. 8) to passive element 102 through dielectric layer 104 and dummy interconnect portion 150 (FIG. 8) overlapping at least a portion of dummy passive element 106 are formed. This step may be completed, for example, by patterning a photoresist, etching, and removing the photoresist to create openings 180, as shown in FIG. 7. This process may be implemented as a single damascene process, or as shown, as a dual damascene process. Openings 182 for interconnect 142 (FIG. 2) to structure other than passive element 102 may also be formed at this point.

As shown in FIG. 8, conductive material is deposited such as a metal or polysilicon to form interconnects 140, 142 and dummy interconnect portion 150, e.g., by CVD, LPCVD, PECVD, SACVD, PVD, ALD, HDPCVD, etc. As mentioned above, dummy interconnect portion 150 overlaps a portion of dummy passive element 106 and, as shown in FIG. 4, substantially surrounds passive element 102.

As best observed in FIG. 2, the structure shown in FIG. 8 eliminates the need to perform interlayer or intermetal dielectric chemical mechanical polishing (planarizing) due to the low aspect ratio of dummy interconnect portions 150, the non-planarity of which may be easily compensated by later dielectric layer(s) 160. In particular, forming another dielectric layer 160 and another interconnect 162 to interconnect 140 can be easily achieved without planarizing dielectric layer 104 using the embodiments described above. In this case, dielectric layer 160 (including any of the afore-mentioned materials of dielectric layer 104) may be formed and patterned in any now known or later developed fashion, e.g., using a single damascene or dual damascene process, and conductive material deposited to form interconnect 162. As also shown in FIG. 2, the above-described embodiments generate via 144 to passive element 102 in dielectric layer 104 such that it has substantially the same height H as via 144 of another interconnect 142 to structure other than passive element 102.

Figure 9:
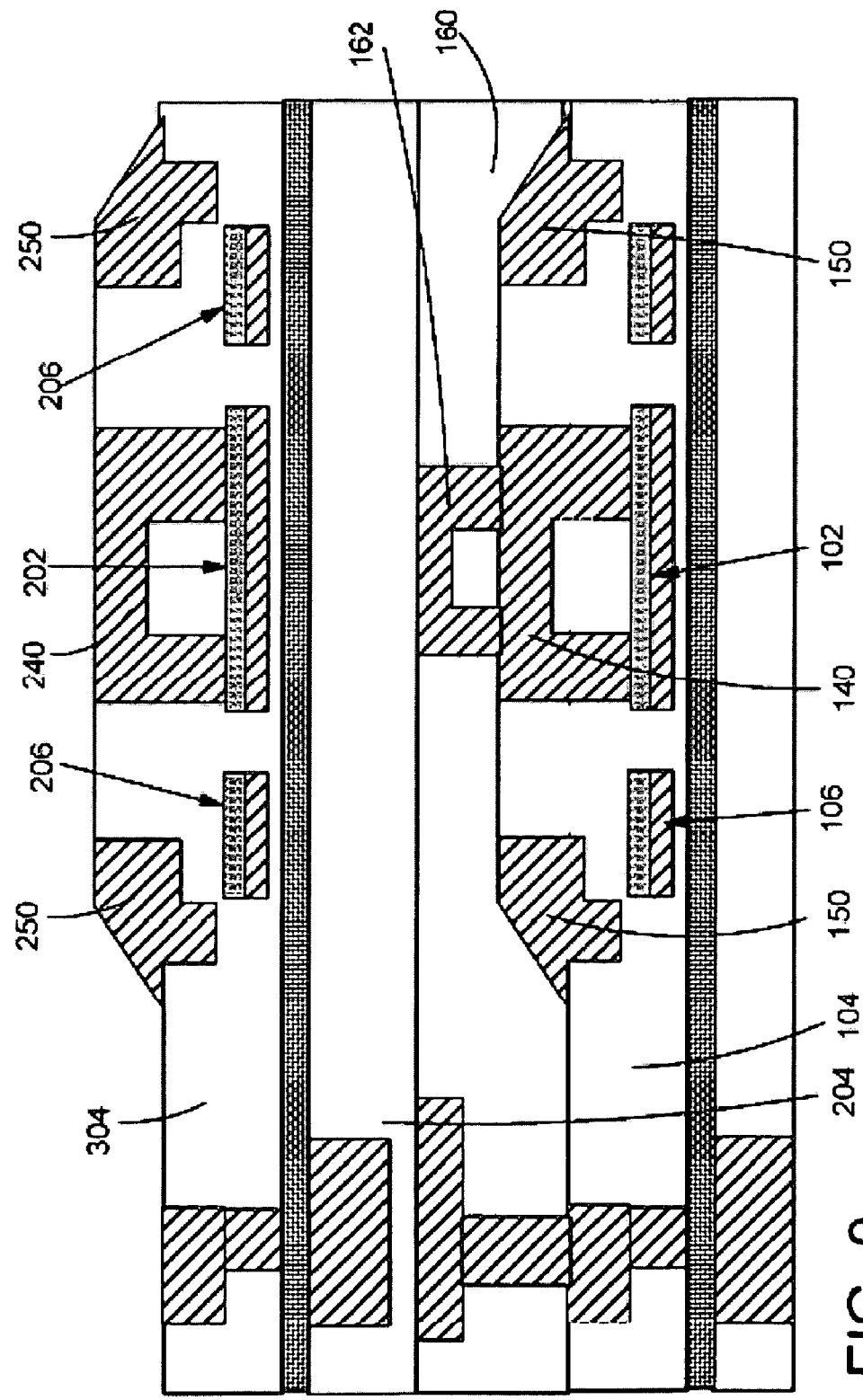
FIG. 9 shows an alternative embodiment of a passive element according to the invention.

FIG. 9 shows an alternative embodiment in which a third dielectric layer 204 and a fourth dielectric layer 304 are formed over second dielectric layer 160 with fourth dielectric layer 304 including another passive element 202 and another dummy passive element 206. An interconnect 240 to passive element 202 through fourth dielectric layer 304 and a dummy interconnect portion 240 overlapping at least a portion of dummy passive element 206 may also be provided. Other structure (not shown) similar to that described above relative to FIG. 2 may also be provided.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method of fabricating a passive element, the method comprising:
   forming the passive element and a dummy passive element adjacent to the passive element, wherein the dummy passive element substantially surrounds the passive element;
   forming a first dielectric layer over the passive element and the dummy passive element, wherein the first dielectric layer is substantially planar over an area between the passive element and the dummy passive element; wherein the first dielectric layer forming includes forming a step in the first dielectric layer above an outer edge of the dummy passive element; and
   forming a first interconnect to the passive element through the first dielectric layer and a dummy interconnect portion overlapping at least a portion of the dummy passive element, wherein the dummy interconnect portion forming includes forming an opening at the step in the first dielectric layer and depositing a conductive material into the opening to form the dummy interconnect portion.

2. The method of claim 1, further comprising forming a second dielectric layer and a second interconnect to the first interconnect in the second dielectric layer without planarizing the first dielectric layer.

3. The method of claim 2, further comprising forming a third and fourth dielectric layer over the second dielectric layer with the fourth dielectric layer including another passive element and another dummy passive element.

4. The method of claim 1, wherein the dummy interconnect portion substantially surrounds the passive element.

5. The method of claim 4, wherein the dummy interconnect portion overlaps the dummy passive element along substantially all of the dummy passive element.

6. The method of claim 1, wherein the first interconnect includes a via to the passive element in the first dielectric layer that has substantially the same height as a via of another interconnect to a structure other than the passive element.

7. The method of claim 1, wherein the dummy passive element is present in substantially all of the dielectric layer excepting where a via or the passive element exists.

8. The method of claim 1, wherein the passive element is selected from the group consisting of: a thin-film resistor and a metal-insulator-metal capacitor.

9. A method of fabricating a passive element, the method comprising:
   forming the passive element and a dummy passive element adjacent to the passive element, wherein the dummy passive element substantially surrounds the passive element;
   forming a first dielectric layer over the passive element and the dummy passive element including forming a step in the first dielectric layer above an outer edge of the dummy passive element;
   forming in the first dielectric layer a first interconnect to the passive element through the first dielectric layer and a dummy interconnect portion overlapping at least a portion of the dummy passive element; and
   forming a second dielectric layer and a second interconnect to the first interconnect without planarizing the first dielectric layer.

10. A method of fabricating a passive element, the method comprising:
    forming the passive element and a dummy passive element adjacent to the passive element, wherein the dummy passive element substantially surrounds the passive element;
    forming a first dielectric layer over the passive element and the dummy passive element, wherein the first dielectric layer is substantially planar over an area between the passive element and the dummy passive element; wherein the first dielectric layer forming includes forming a step in the first dielectric layer above an outer edge of the dummy passive element; and
    forming a first interconnect to the passive element through the first dielectric layer and a dummy interconnect portion overlapping at least a portion of the dummy passive element.

* * * * *